(12) United States Patent
Lee et al.

(10) Patent No.: US 11,461,624 B2
(45) Date of Patent: *Oct. 4, 2022

(54) NEURAL NETWORK WITH SYNAPSE STRING ARRAY

(71) Applicant: Seoul National University R&DB FOUNDATION, Seoul (KR)

(72) Inventors: Jong-Ho Lee, Seoul (KR); Sung-Tae Lee, Gwacheon-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 353 days.

This patent is subject to a terminal disclaimer.

(21) Appl. No.: 16/819,798

(22) Filed: Mar. 16, 2020

(65) Prior Publication Data

US 2021/0166108 A1  Jun. 3, 2021

(30) Foreign Application Priority Data

Dec. 3, 2019 (KR) .................. 10-2019-0158969

(51) Int. Cl.
*G11C 5/06* (2006.01)
*G06N 3/063* (2006.01)
(Continued)

(52) U.S. Cl.
CPC ............. *G06N 3/063* (2013.01); *G06N 3/04* (2013.01); *G11C 16/0483* (2013.01);
(Continued)

(58) Field of Classification Search
CPC ....... G11C 5/063; G11C 7/18; G11C 11/4097; G11C 5/025; G11C 5/104
(Continued)

(56) References Cited

U.S. PATENT DOCUMENTS

| 10,957,396 | B2 * | 3/2021 | Lee ............... G11C 16/0483 |
| 2012/0300546 | A1 * | 11/2012 | Tessariol ........... G11C 16/10 257/314 |
| 2019/0295653 | A1 * | 9/2019 | Yip ................... G11C 16/08 |

FOREIGN PATENT DOCUMENTS

| KR | 20150034900 | 4/2015 |
| KR | 101701250 | 2/2017 |
| WO | 2013000939 | 1/2013 |

OTHER PUBLICATIONS

Bankman, et al.. An Always-On 3.8uJ/86% CIFAR-10 Mixed-Signal Binary CNN Processor with All Memory on Chip in 28nm CMOS, Machine Learning and Signal Processing, 2018, pp. 222-224.

(Continued)

*Primary Examiner* — Son T Dinh
(74) *Attorney, Agent, or Firm* — Cantor Colburn LLP

(57) ABSTRACT

Provided is a binary neural network including: a synapse string array in which multiple synapse strings are sequentially connected. The synapse string includes: first and second cell strings, each including memory cell devices connected in series; and switching devices connected to first ends of two-side ends of the first and second cell strings. The memory cell devices of the first and second cell strings are in one-to-on correspondence to each other, and a pair of the memory cell devices being in one-to-on correspondence to each other have one-side terminals electrically connected to each other to constitute one synapse morphic device. A plurality of the pairs of memory cell devices configured with the first and second cell strings constituting each synapse string constitute a plurality of the synapse morphic devices. The synapse morphic devices of each synapse string are electrically connected to the synapse morphic devices of other synapse strings.

20 Claims, 10 Drawing Sheets

(51) Int. Cl.
     *G11C 16/04*     (2006.01)
     *G06N 3/04*     (2006.01)
     *G11C 16/14*     (2006.01)
     *G11C 16/26*     (2006.01)
     *G11C 16/10*     (2006.01)
(52) U.S. Cl.
     CPC .............. *G11C 16/10* (2013.01); *G11C 16/14* (2013.01); *G11C 16/26* (2013.01)
(58) Field of Classification Search
     USPC ........................................................ 365/63
     See application file for complete search history.

(56) References Cited

OTHER PUBLICATIONS

Merrikh-Bayat, et al., High-Performance Mixed-Signal Neurocomputing With Nanoscale Floating-Gate Memory Cell Arrays, IEEE Transactions on Neural Networks and Learning Systems, 2018, pp. 4782-4790.

Sun, et al., XNOR-RRAM: A Scalable and Parallel Resistive Synaptic Architecture for Binary Neural Networks, Design, Automation and Test in Europe, 2018, pp. 1423-1428.

Wang, et al.. The Method of Predicting Retention Threshold Voltage Distribution for NAND Flash Memory Based on Back-Propagation Neural Network, 2019 IEEE 11th International Memory Workshop (IMW), 2019, pp. 1-4.

\* cited by examiner

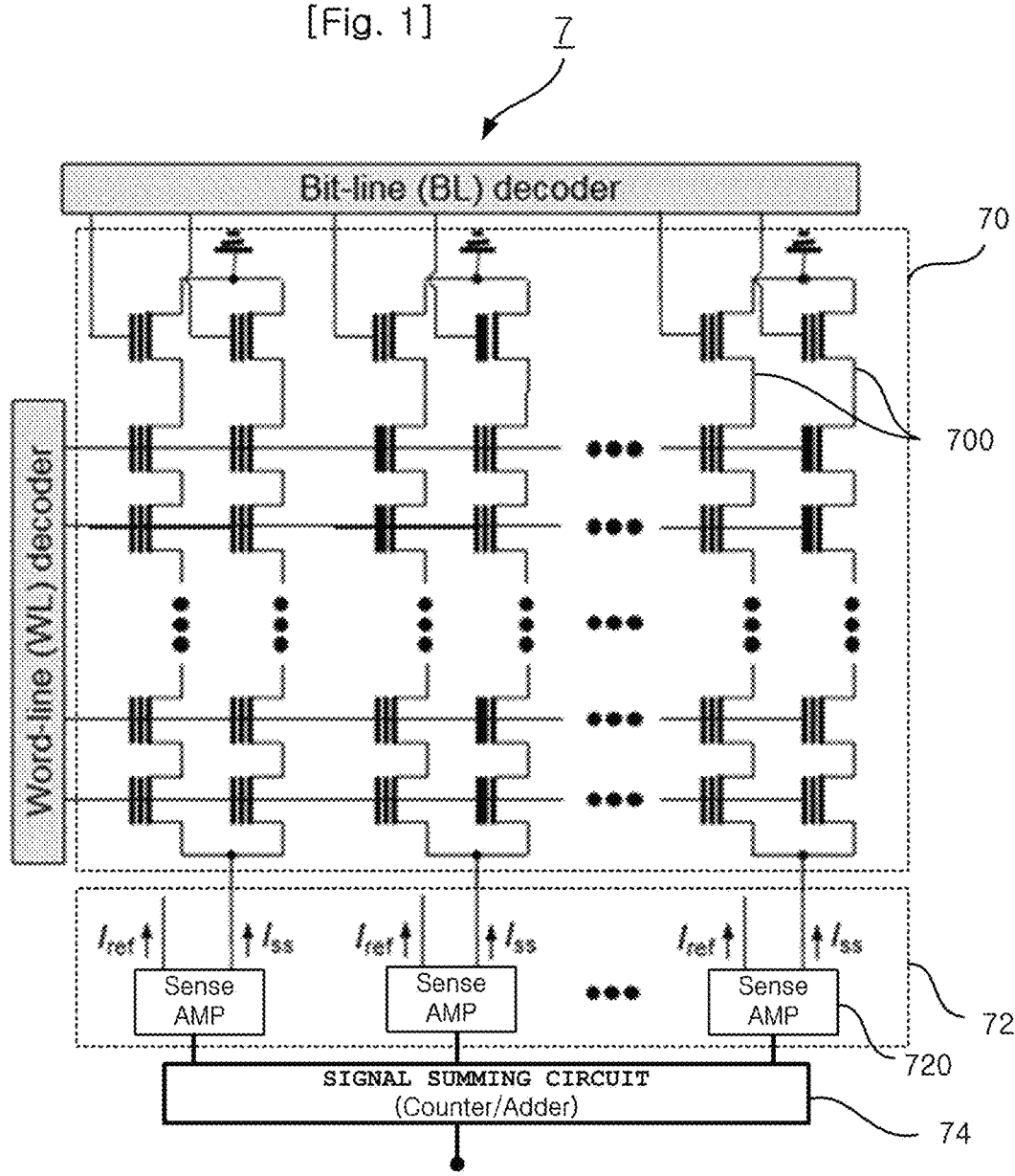
[Fig. 1]

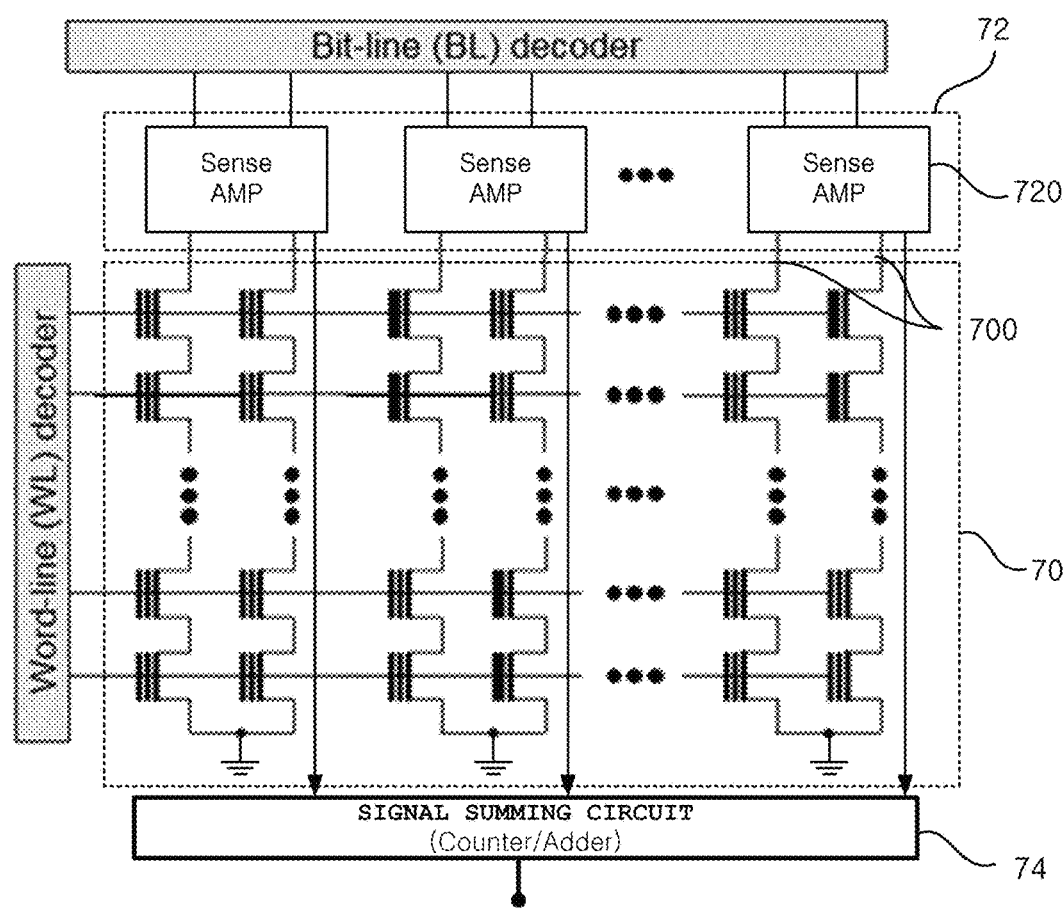
[Fig. 2]

[Fig. 3]
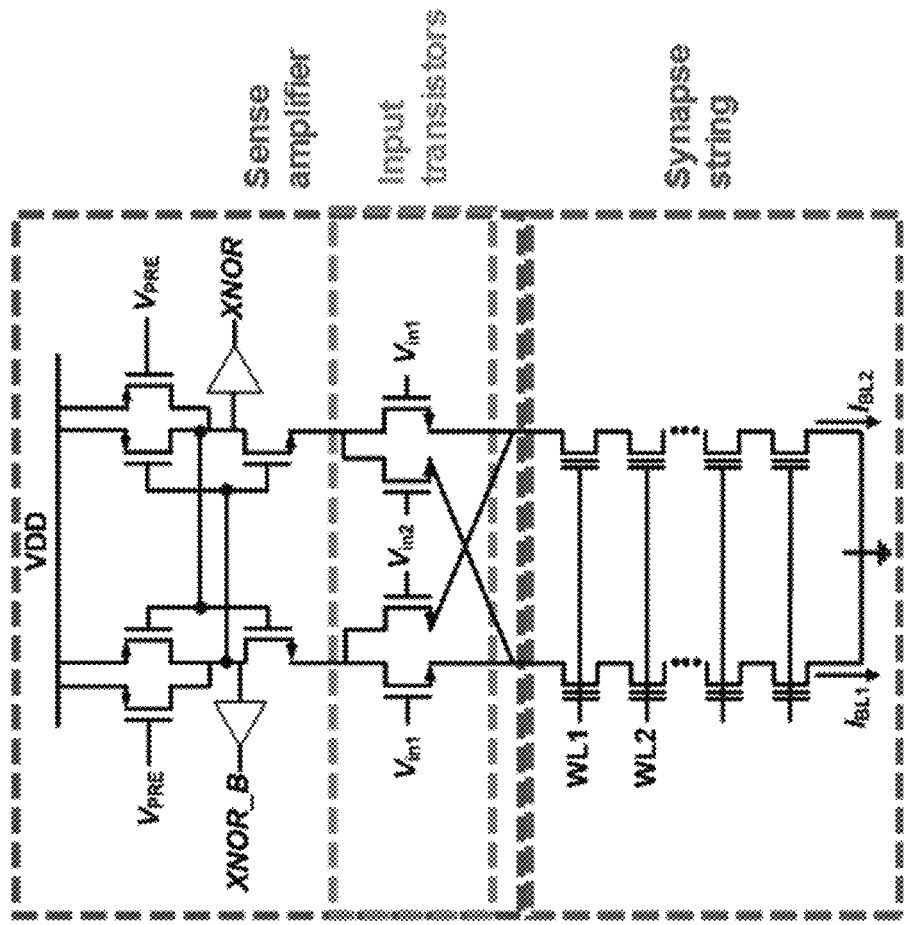
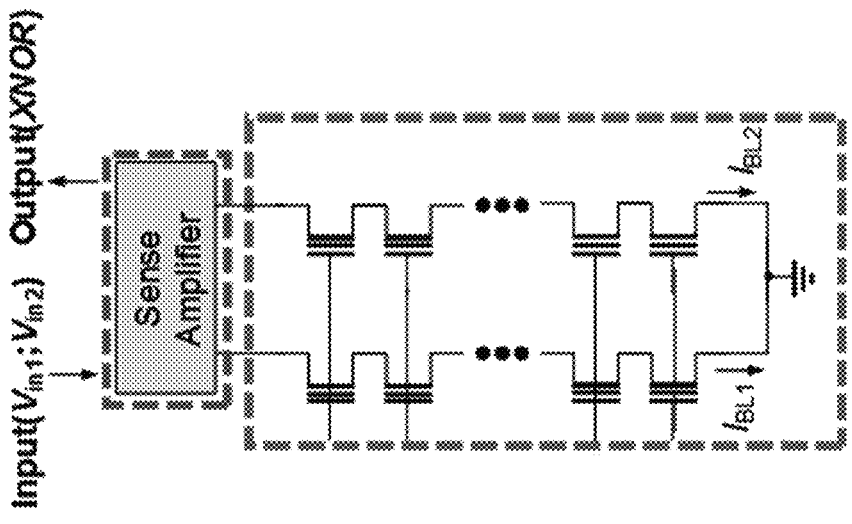

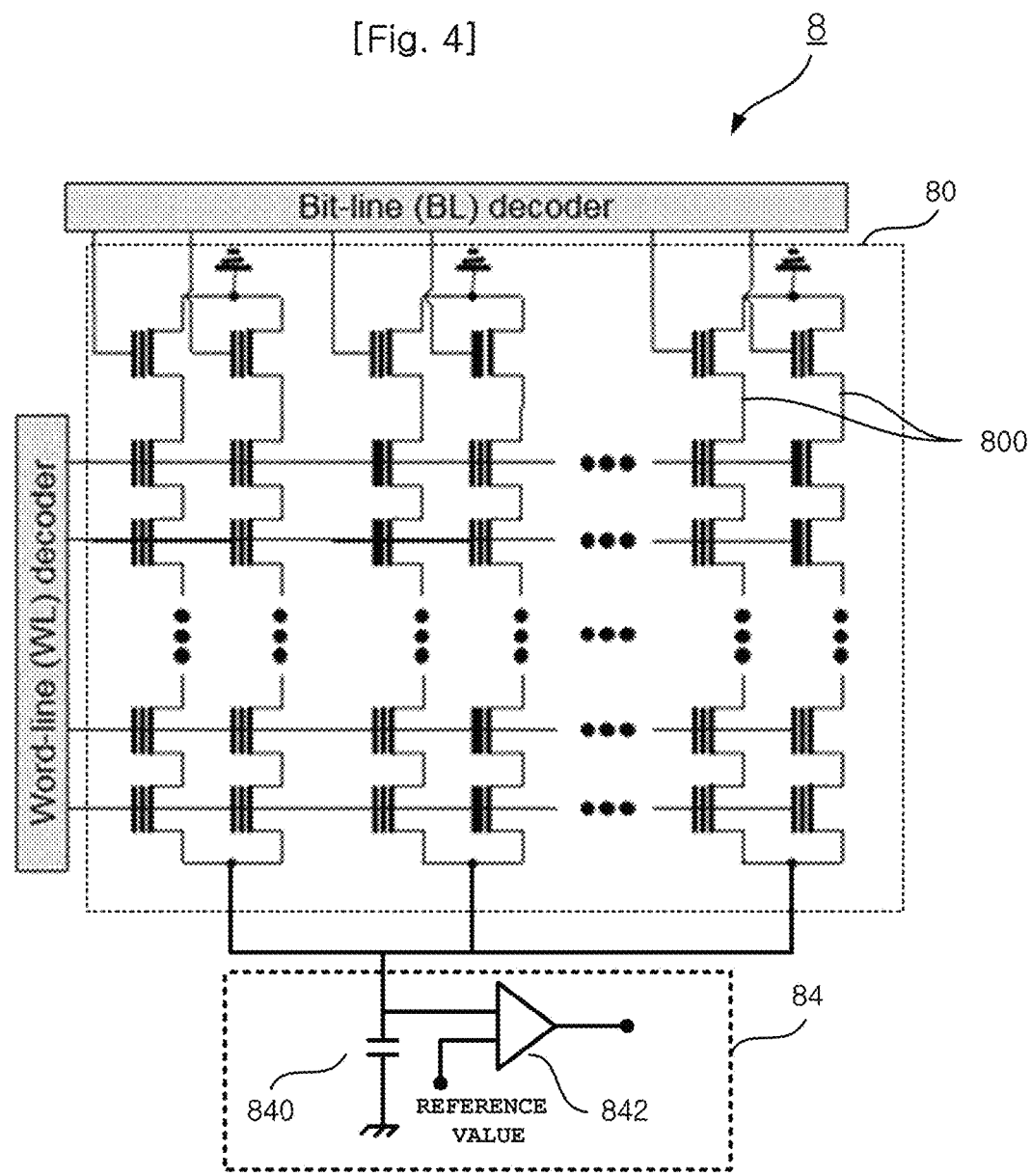
[Fig. 4]

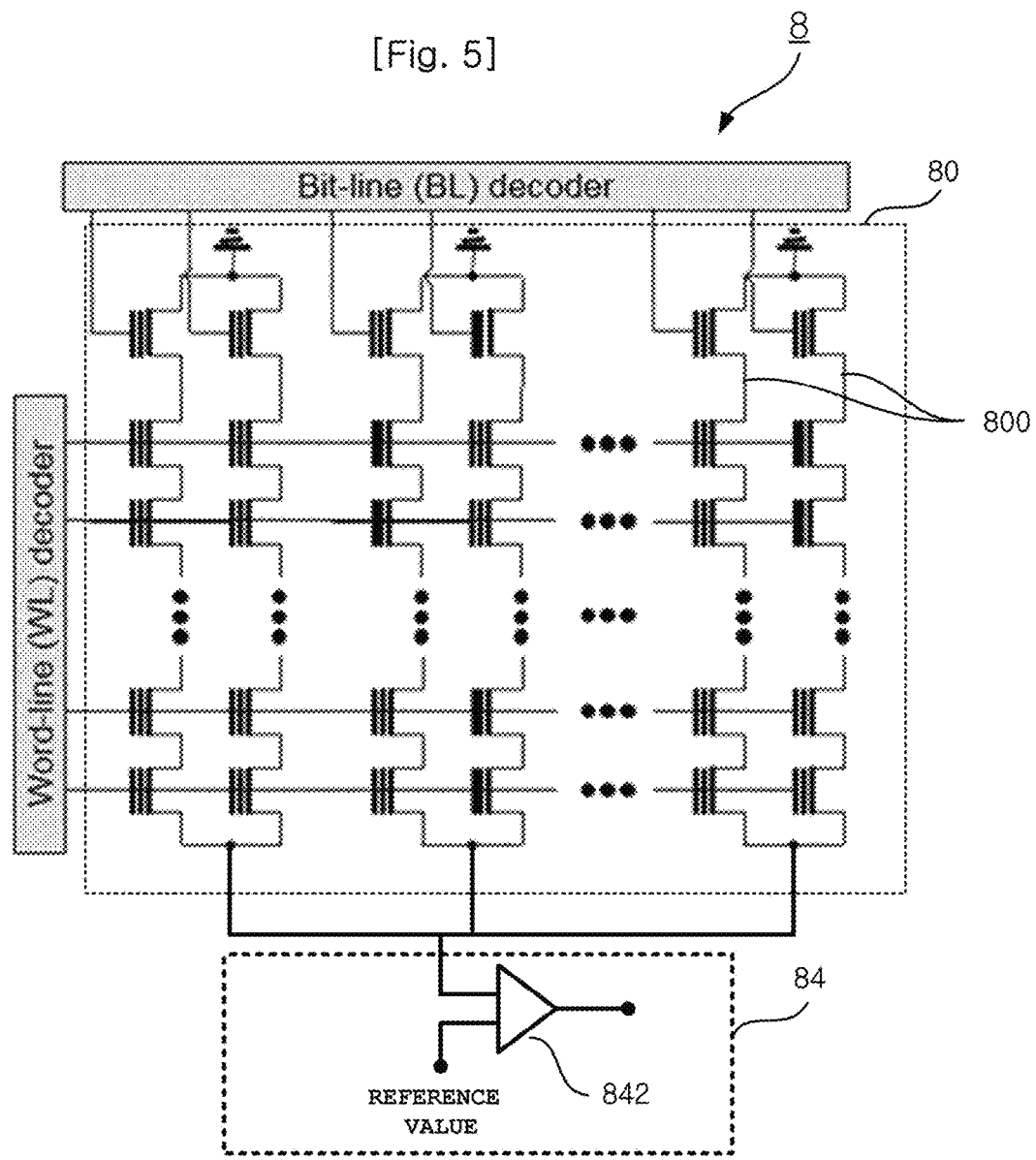
[Fig. 5]

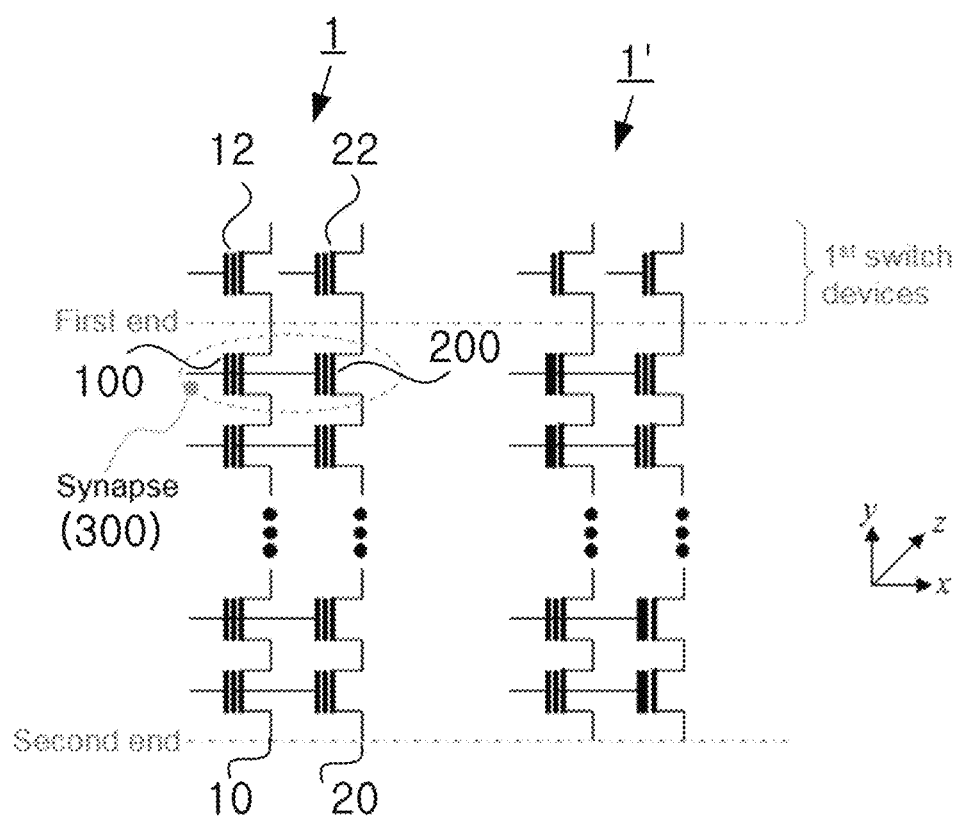

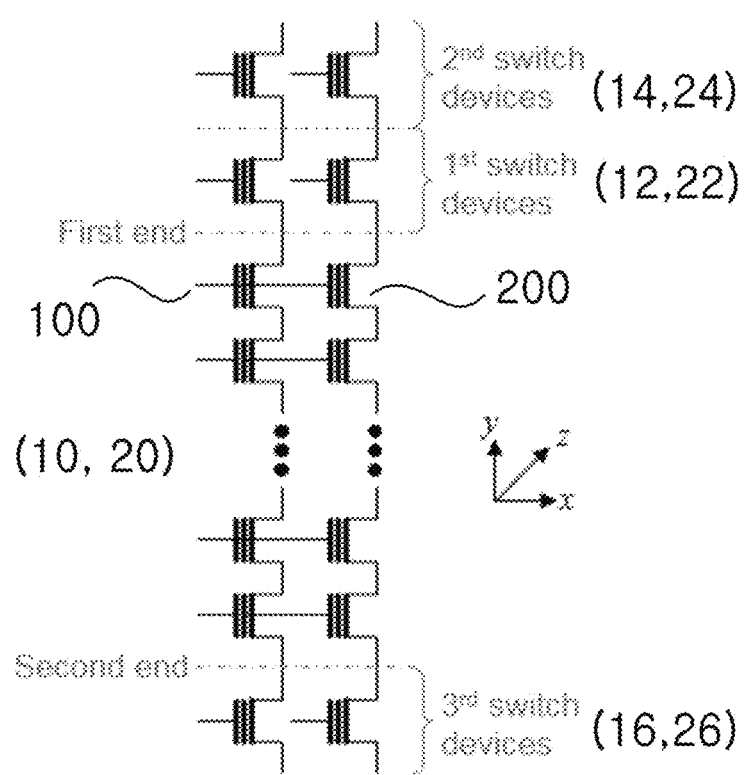
[Fig. 7]

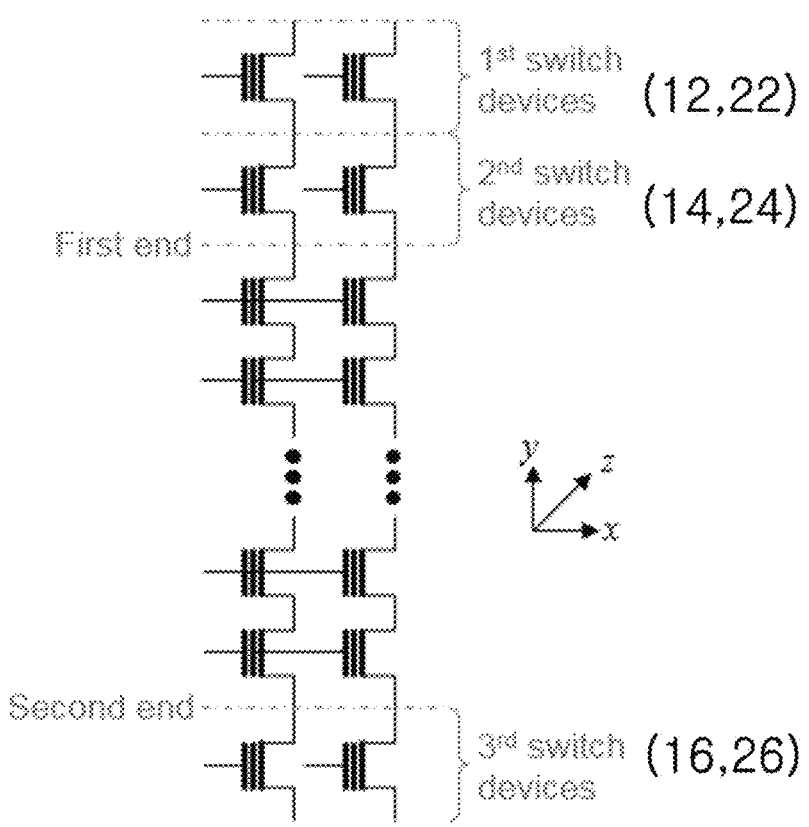
[Fig. 8]

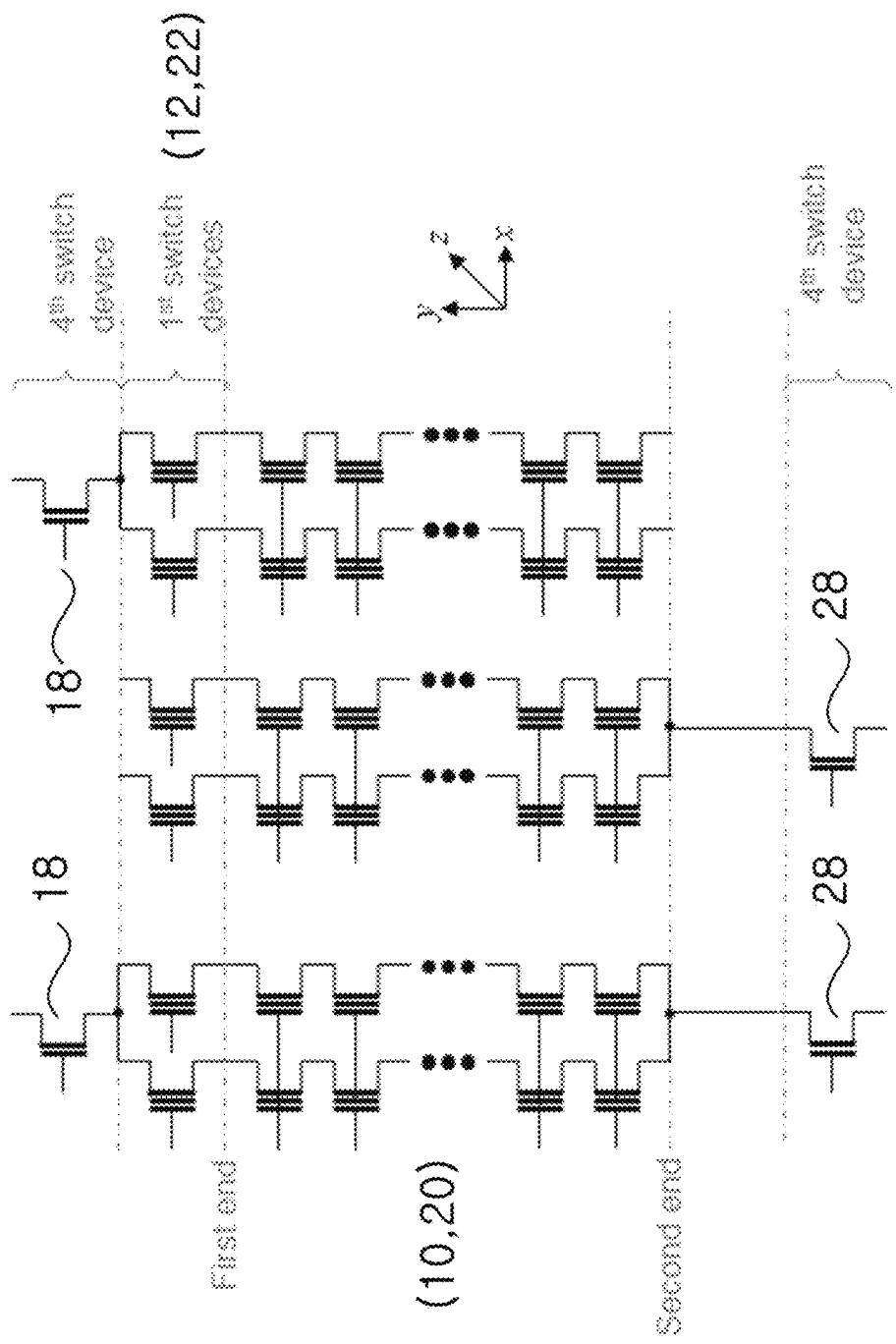

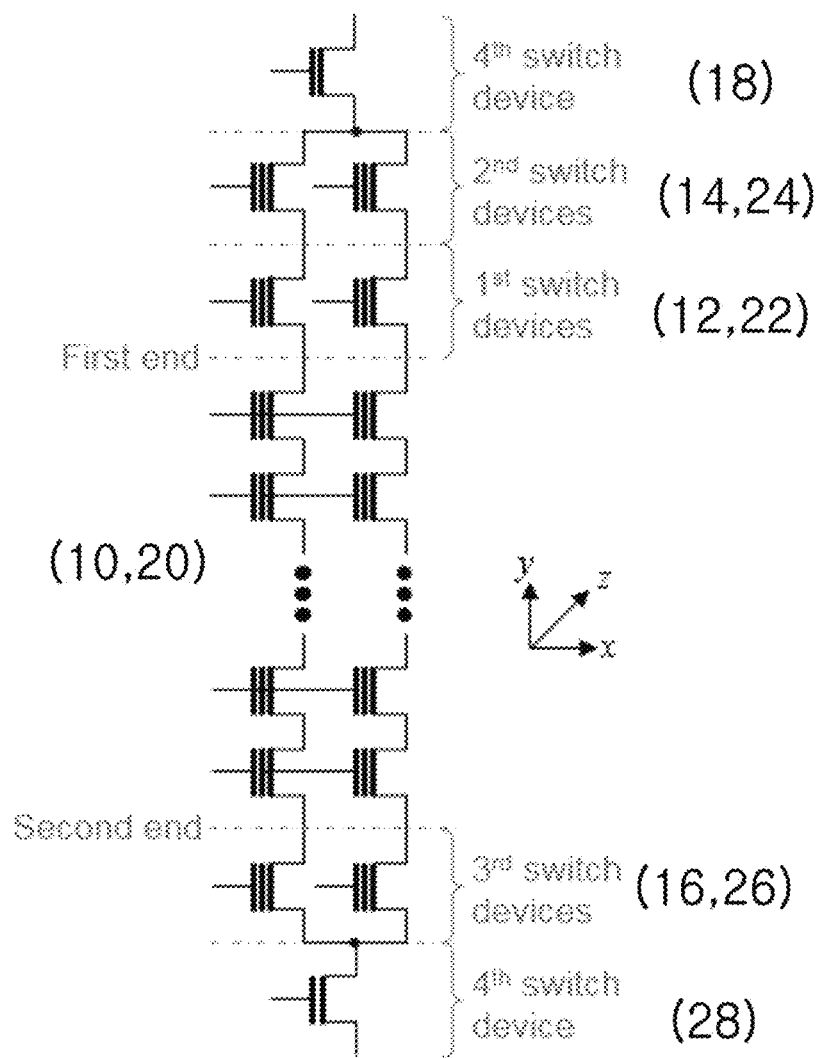

NEURAL NETWORK WITH SYNAPSE STRING ARRAY

BACKGROUND OF THE INVENTION

1. Field of the Invention

The present invention relates to a neuromorphic technology that can be applied to various neural networks including binary neural networks, and more particularly, a neural network configured with a synapse string array using a synapse string including a plurality of synapse morphic devices having a high degree of integration, low power, and high durability by using two two-dimensional or three-dimensional memory cell strings and switching devices connected in series to the strings and synapse strings having a neuron function.

2. Description of the Related Art

In recent years, many approaches have been made to imitate nervous systems of animals as power consumption has increased significantly and heat release problems have become more serious in integrated circuits based on the von Neumann architecture. Particularly, in the techniques imitating the nervous systems of animals, it is possible to improve the cognitive function and the determining function by enabling cognitive function and learning while greatly reducing power consumption.

As a result, there is an opportunity to replace or greatly improve the functionality of the existing von Neumann integrated circuits. Therefore, much attention has been increasingly paid to the technique, and the need for research has been greatly increased.

The basic function of neurons is to generate electrical spikes and transmit information to other cells in a case where a stimulus exceeds a threshold value. The resulting electrical signal is called an action potential. Neurons may be roughly divided into three portions. The neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging the stimulus occurs at the synapse. One nerve cell (neuron) receives stimuli through a number of synapses and integrates the excitations, and after that, the nerve cell transmits an electrical spike to an axon near to the nerve cell body, so that the electrical spike reaches the synapse.

In this manner, the transmission of the excitations from the neuron through the synapses to another nerve cell is referred to as excitation transmission. The excitation at the synapse is transmitted only from a nerve fiber toward a nerve cell body or a dendrite and is not transmitted in the reverse direction, so that the excitation is transmitted in only one direction as a whole.

In addition, the synapses are not only relay sites that transmit the excitations but the synapses also cause weighting or inhibition according to temporal or spatial change in excitations reaching the synapses to enable higher level integration of the nervous system.

On the other hand, besides the synapses having the action of transmitting the excitation, there are synapses having the action of inhibiting the transmission of the excitations from other nerve cells. These synapses are called inhibitory synapses. When the excitation transmitted along some nerve fibers reaches the inhibitory synapse, the inhibitory transmitting material is secreted from the synapse. This inhibitory transmitting material acts on a cell membrane of the nerve cell connected to the synapse to inhibit the excitations of the cell from occurring (occurrence of an action potential). As a result, while the inhibitory transmitting material acts, the excitation reaching other synapses is not transmitted to the synapse.

Recently, binary neural networks have been actively studied, which limits the values of synapses and neurons to values of −1 and 1 and performs forward and reverse propagation. The binary neural networks are advantageous in terms of area and power due to elimination of multipliers. Recently, there have been attempts to implement binary neural networks by using RRAM devices (Xiaoyu Sun et al., "XNOR-RRAM: A Scalable and Parallel Resistive Synaptic Architecture for Binary Neural Networks", 2018 Design, Automation & Test in Europe Conference & Exhibition). Herein, a 2T2R structure was used as a synapse, and a structure of performing an XNOR operation by using the synapse was devised, and the structure was used for binary neural networks. However, in the case of a MEMRISTOR-based synapse of the related art, there are disadvantages in that the reliability of the device is not good and the dispersion between the devices is large.

In addition, recently, there have been attempts to implement binary neural networks by using logic gates (Daniel Bankman et al., "An always-on 3.8 uJ/86% CIFAR-10 Mixed-signal binary CNN processor with all memory on chip in 28 nm CMOS", 2018ISSCC). However, implementing a binary neural network by using a logic gate according to the related art described above has a disadvantage in that reliability is good but a degree of integration is low due to using several devices.

Therefore, the present invention preferably proposes a method of implementing a binary neural network by using a NAND flash memory cell having a high degree of integration and high reliability as a synapse morphic device and a method of applying a modified NAND flash memory cell to a more complicated, diverse neural network.

SUMMARY OF THE INVENTION

The present invention is to provide a neural network using a synapse string array configured with synapse strings including a plurality of synapse morphic device and switching devices having high reliability, low power, and a high degree of integration.

According to a first aspect of the present invention, there is provided a binary neural network including a synapse string array in which a plurality of synapse strings are sequentially connected, wherein the synapse string of the synapse string array includes: first and second cell strings, each of which includes a plurality of memory cell devices connected in series; and switching devices which are connected to first ends of two-side ends of the first and second cell strings, wherein the memory cell devices of the first cell string and the memory cell devices of the second cell string are in one-to-on correspondence to each other, and a pair of the memory cell devices being in one-to-on correspondence to each other have one-side terminals electrically connected to each other to constitute one synapse morphic device, wherein a plurality of the pairs of memory cell devices configured with the first and second cell strings constituting each synapse string constitute a plurality of the synapse morphic devices, wherein the synapse morphic devices of each synapse string are electrically connected to the synapse morphic devices of other synapse strings, wherein the synapse morphic devices of each synapse string are electrically connected to the synapse morphic devices of other synapse strings, and terminals electrically connected to each other in the synapse morphic devices are terminals applied with a read or pass voltage or applied with a program or erase voltage, and wherein, when the read voltage is applied to the electrically connected terminals of the synapse morphic device, an output value for a specific neuron of a post-synapse neuron (post-neuron) layer.

In the binary neural network according to the above-described aspect, it is preferable that the binary neural network further includes: a sensing circuit unit which has a plurality of sense circuits connected to one-side ends of the plurality of synapse strings of the synapse string array, each sensing circuit configured to sense and output a current from the connected synapse strings; and a signal summing circuit which sums values output from the plurality of sensing circuits of the sensing circuit unit and outputs a summation value, wherein second ends of the two-side ends of the first and second cell strings of the synapse string of the synapse string array are connected to the sensing circuits.

In the binary neural network according to the above-described aspect, it is preferable that the terminals electrically connected to each other in the memory cell devices being in one-to-one correspondence with each other in the first cell string and the second cell string constituting each synapse string are terminals applied with a read or pass voltage or applied with a program or erase voltage, and a plurality of the pairs of memory cell devices configured with the first and second cell strings constituting each synapse string constitute a plurality of synapse morphic devices.

In the binary neural network according to the above-described aspect, it is preferable that the memory cell devices and the switching devices constituting one synapse morphic device in the synapse string are configured so as to perform an XNOR operation.

In the binary neural network according to the above-described aspect, it is preferable that the sensing circuit unit further includes a reference current source for supplying a reference current, and each sensing circuit is input with a reference current ($I_{ref}$) flowing through the reference current source and compares the synapse string current ($I_{ss}$) for the synapse with the reference current to output the comparison result.

In the binary neural network according to the above-described aspect, it is preferable that the sensing circuit unit compares the magnitude of the current of the first cell string with the current of the second cell string and outputs the comparison result.

In the binary neural network according to the above-described aspect, it is preferable that the signal summing circuit is configured an adder or a counter.

In the binary neural network according to the above-described aspect, it is preferable that the network is further comprising a comparator that compares a value output from the signal summing circuit with a preset reference value and outputs a comparison value.

According to a first aspect of the present invention, there is provided a binary neural network including a synapse string array in which a plurality of synapse strings are sequentially connected; and a switching circuit unit which switches when a sum of currents or voltages output from the synapse strings reaches a preset threshold value;

wherein the synapse string of the synapse string array includes: first and second cell strings, each of which has a plurality of memory cell devices connected in series; and switching devices which are connected to first ends of two-side ends of the first and second cell strings, wherein second ends of the two-side ends of the first and second cell strings are coupled to each other to be connected to the switching circuit unit, wherein the memory cell devices of the first cell string and the memory cell devices of the second cell string are in one-to-one correspondence with each other, and a pair of the memory cell devices being in one-to-one correspondence with each other have one-side terminals electrically connected to each other to constitute one synapse morphic device, wherein a plurality of the pairs of memory cell devices configured with the first and second cell strings constituting each synapse string constitute a plurality of the synapse morphic devices, and wherein the synapse morphic devices of each synapse string are electrically connected to the synapse morphic devices of other synapse strings, and terminals electrically connected to each other in the synapse morphic devices are terminals applied with a read or pass voltage or applied with a program or erase voltage.

In the binary neural network according to the above-described aspect, it is preferable that the terminals electrically connected to each other in the memory cell devices being in one-to-one correspondence with each other in the first cell string and the second cell string constituting each synapse string are terminals applied with a read or pass voltage or applied with a program or erase voltage, and a plurality of the pairs of memory cell devices configured with the first and second cell strings constituting each synapse string constitute a plurality of synapse morphic devices.

In the binary neural network according to the above-described aspect, it is preferable that the memory cell devices and the switching devices constituting one synapse morphic device in the synapse string are configured so as to perform an XNOR operation.

In the binary neural network according to the above-described aspect, it is preferable that the switching circuit unit includes: a capacitor that stores a current or voltage input from the synapse string array; and a comparator that compares a charging voltage of the capacitor with a preset reference value and outputting a comparison value.

In the binary neural network according to the above-described aspect, it is preferable that the switching circuit unit includes a comparator configured to compare a current or voltage input from the synapse string array with a preset threshold value and to output a comparison value.

In the binary neural network according to the above-described aspect, it is preferable that the switching circuit unit includes a device which performs steep switching when the current or voltage input from the synapse string array reaches a preset threshold value.

In the binary neural network according to the above-described aspect, it is preferable that the switching device of the switching circuit unit is configured with a pnpn diode or a npnp diode that performs positive feedback.

In the binary neural network according to the above-described aspect, it is preferable that in the switching device, a gate insulating film stack including an insulating layer having a charge storage function is further provided on the pnpn diode or the npnp diode; a gate electrode is provided on the gate insulating film stack; and at least one gate electrode is provided on an n or p region of the pnpn diode or the npnp diode.

In the binary neural network according to the above-described aspect, it is preferable that the switching circuit unit includes: a capacitor that stores a voltage input from the synapse string array; and an insulator metal transition (IMT) device that performs steep switching when a charging voltage of the capacitor reaches a preset threshold value.

In the binary neural network according to the above-described aspect, it is preferable that the switching circuit unit includes a MOSFET or a double-gate MOSFET which performs steep switching when a current or voltage input from the synapse string array reaches a preset threshold value.

In the binary neural network according to the above-described aspect, it is preferable that in the switching circuit unit, a gate insulating film stack including an insulating layer having a charge storage function is provided at least between a gate electrode and a channel, and the gate insulating film stack includes a charge storage layer.

In the binary neural network according to the above-described aspect, it is preferable that in the double-gate MOSFET of the switching circuit unit, a gate insulating film stack including an insulating layer having a charge storage function is provided at least between a gate electrode and a channel, and two gates are electrically separated from each other.

The synapse strings according to the present invention includes the plurality of synapse morphic devices connected in series, and thus, it is possible to greatly improve the degree of integration.

In addition, the synapse morphic device of the synapse string according to the present invention is configured with two MOSFETs or flash memory cell devices including a charge storage layer, and thus, it is possible to obtain high durability and high reliability.

In addition, the synapse string according to the present invention is configured with a plurality of synapse morphic devices and the first switch devices connected in series, and thus, it is possible to perform a stable XNOR operation.

In addition, it is possible to manufacture the synapse string and synapse string array according to the present invention by using the existing two-dimensional or three-dimensional NAND flash technology. Therefore, in a case where the binary neural network is configured by using the synapse strings and the synapse string arrays according to the present invention, it is possible to greatly increase the degree of integration and the reliability of the binary neural networks and to reduce the power consumption.

In addition, by adding additional circuits and switches to the synapse string of the present invention, it is possible to implement ternary neural networks or more diverse neural networks, and it is possible to enable recognition of complicated and high-level data.

BRIEF DESCRIPTION OF THE DRAWINGS

FIG. 1 is a circuit diagram illustrating a structure of a binary neural network according to a first embodiment of the present invention;

FIG. 2 is a circuit diagram illustrating a second example of a sensing circuit unit in the binary neural network according to the first embodiment of the present invention;

FIG. 3 is a circuit diagram illustrating an example of a sensing circuit unit in the binary neural network according to the second example;

FIG. 4 is a circuit diagram illustrating a structure of a binary neural network according to a second embodiment of the present invention;

FIG. 5 is a circuit diagram illustrating a second example of the switching circuit unit 24 in the binary neural network according to the second embodiment of the present invention; and FIGS. 6A and 6B are circuit diagrams illustrating one example of a synapse string according to the first embodiment of the present invention.

FIG. 7 is a circuit diagram illustrating a second example of the synapse string according to the first embodiment of the present invention;

FIG. 8 is a circuit diagram illustrating a modified form of positions of the second switch devices in the second example of the synapse string according to the first embodiment of the present invention;

FIGS. 9A to 9C are circuit diagrams illustrating a fourth example of the synapse string according to the first embodiment of the present invention;

FIG. 10 is a circuit diagram illustrating a fifth example of the synapse string according to the first embodiment of the present invention.

DETAILED DESCRIPTION

Hereinafter, structures and operations of binary neural networks according to preferred embodiments of the present invention will be described in detail with reference to the accompanying drawings.

First Embodiment

First, structure and operations of a binary neural network according to a first embodiment of the present invention will be described in detail with reference to FIG. 1.

FIG. 1 is a circuit diagram illustrating the structure of the binary neural network according to a first embodiment of the present invention. Referring to FIG. 1, the binary neural network 7 according to the first embodiment of the present invention is configured to include a synapse string array 70 in which a plurality of synapse strings 700 are sequentially connected, a sensing circuit unit 72 including sensing circuits, and a signal summing circuit 74, so that the binary neural network sums values output from the synapse strings and outputs a summation value. The binary neural network having the above-described configuration can provide the sum of the weights of the plurality of synapse morphic devices constituting the plurality of synapse strings.

The first example of the sensing circuit unit 72 includes a plurality of sensing circuits (sense amplifier 720) connected to one-side ends of the plurality of synapse strings 700 of the synapse string array, and each sensing circuit 720 is configured to detect and output a synapse string current $I_{ss}$ which is a current of the connected synapse string. The signal summing circuit 74 may be configured with an adder or a counter, and the signal summing circuit sums values output from the plurality of sensing circuits of the sensing circuit unit and outputs a summation value. The synapse string 700 of the synapse string array 70 includes first and second cell strings, each of which has a plurality of memory cell devices connected in series, and switching devices connected to first ends among two-side ends of the first and second cell strings. Second ends of the two-side ends of the first and second cell strings are coupled to each other to be connected to the sensing circuit. The memory cell devices of the first cell string and the memory cell devices of the second cell string are in one-to-one correspondence with each other. A pair of the memory cell devices being in one-to-one correspondence with each other have one-side terminals electrically connected to each other to constitute one synapse morphic device. A plurality of the pairs of memory cell devices configured with the first and second cell strings constituting each synapse string constitute a plurality of the synapse morphic devices. It is preferable that the terminals electrically connected to each other in the memory cell devices being in one-to-one correspondence with each other in the first cell string and the second cell string constituting each synapse string are terminals applied with a read or pass voltage or are applied with a program or erase voltage. In the synapse string, the memory cell devices and the switching devices constituting one synapse morphic device are configured so as to perform an XNOR operation. Various examples of the synapse strings will be described below.

The synapse morphic devices of each synapse string are electrically connected to the synapse morphic devices of other synapse strings, and the terminals with which the synapse morphic devices are electrically connected to each other are terminals applied with a read or pass voltage or a program or erase voltage.

The sensing circuit unit further includes a reference current source for supplying a reference current. It is preferable that each sensing circuit is configured to be input with a reference current $I_{ref}$ flowing from the reference current source and to compare the synapse string current $I_{ss}$ for the synapse with the reference current $I_{ref}$ and to output the comparison result.

The binary neural network having the above-described configuration can provide the sum of the weights of the plurality of synapse morphic device that constituting the plurality of synapse strings.

FIG. 2 is a circuit diagram illustrating a second example of the sensing circuit unit in the binary neural network according to the first embodiment of the present invention. Referring to FIG. 2, the sensing circuit unit compares the current of the first string with the current of the second string and outputs an output value. The signal summing circuit may be configured with an adder or a counter, and the signal summing circuit sums values output from the plurality of sensing circuits of the sensing circuit unit and outputs an output value.

The sensing circuit unit 72 is configured with a plurality of sensing circuits (sense amplifiers) 720 connected to one-side ends of the plurality of synapse strings 700 of the synapse string array, and each of the sensing circuits 720 compares the current of the first cell string and the current of the second cell string and outputs an output value.

FIG. 3 is a circuit diagram illustrating an example of the sensing circuit unit in the binary neural network according to the second example. For example, second ends of the two-side ends of the first and second cell strings are connected to the sensing circuits and first ends are grounded. The sensing circuit unit (sense amplifier) includes four switching devices. These four switching devices can be used as a portion of the sense amplifier, and input voltages $V_{in1}$ and $V_{in2}$ can be simultaneously applied.

Second Embodiment

Hereinafter, structure and operations of a binary neural network according to a second embodiment of the present invention will be described in detail with reference to FIG. 4.

FIG. 4 is a circuit diagram illustrating the structure of the binary neural network according to the second embodiment of the present invention. Referring to FIG. 4, the binary neural network 8 according to the second embodiment of the present invention includes a synapse string array 80 in which a plurality of synapse strings 800 are sequentially connected and a switching circuit unit 84. Since the synapse string array of the binary neural network 8 according to the second embodiment is the same as those of the first embodiment, redundant descriptions thereof will be omitted.

The switching circuit unit 84 is a circuit which is switched when the sum of the current or voltage output from the sensing circuit unit reaches a preset threshold value.

As illustrated in FIG. 4, the first example of the switching circuit unit 84 may be configured with a capacitor 840 and a comparator 842. The capacitor 840 is connected to an output terminal of the synapse string array so that a current output from the synapse string array unit is stored over time. The current stored in the capacitor becomes charges and is converted into a voltage depending on a given size of the capacitor 840. In the comparator 842, a voltage of the capacitor is input to a first input terminal, a preset reference value is input to a second input terminal, values input to the first and second input terminals are compared, and according to comparison result, +1 or −1 is output. As the above-described comparator, an integrate-and-fire neuron, a sense amplifier, or the like may be used. In addition, the comparator may be configured with a PNPN diode, an NPNP diode, an insulator metal transition (IMT) device, a MOSFET device, or a double-gate MOSFET that performs steep switching by performing positive feedback. In the PNPN or NPNP diode, a gate may be formed in at least one of two regions of N and P regions, and a layer for storing charges may be included between the gate and the N or P region.

FIG. 5 is a circuit diagram illustrating a second example of the switching circuit unit 84 in the binary neural network according to the second embodiment of the present invention. Referring to FIG. 5, the second example of the switching circuit unit may be configured as a comparator. In the comparator 842, a first input terminal is input with a voltage or a current from the synapse string array, and a second input terminal is input with a preset reference value. The comparator compares input values of the first and second input terminals and outputs +1 or −1 depending on the comparison result. As an example of the comparator, a neuron circuit, a sense amplifier, or the like may be used. In addition, the comparator may be configured with a PNPN diode, an NPNP diode, an insulator metal transition (IMT) device, a MOSFET device, or a double-gate MOSFET device that performs steep switching by performing positive feedback. In the PNPN or NPNP diode, a gate may be formed in at least one of two regions of N and P regions, and a layer for storing charges may be included between the gate and the N or P region.

Hereinafter, various examples of the synapse string constituting the synapse string array of the binary neural network according to the first to second embodiments described above will be described.

FIGS. 6A and 6B are circuit diagrams illustrating one example of a synapse string according to the first embodiment of the present invention. Referring to FIGS. 6A and 6B, the synapse string 1 according to the present invention includes a first and second cell strings 10 and 20, each of which has a plurality of memory cell devices 100 and 200 connected in series and first switching devices 12 and 22, each of which is connected to one-side ends of two-side ends of the first and second cell strings. In the present specification, for the convenience of description, the first switching devices are connected to one-side ends of the two-side ends of the first and second cell strings, the one-side ends of the first and second cell strings to which the first switching devices are connected are defined as first ends, and the other-side ends of the first and second cell strings are defined as second ends.

The memory cell devices 100 of the first cell string 10 and the memory cell devices 200 of the second cell string 20 are in one-to-one correspondence with each other, and a pair 300 of the memory cell devices being in one-to-one correspondence with each other constitute one synapse morphic device. It is preferable that the terminals electrically connected to each other in the memory cell devices constituting one synapse morphic device are terminals applied with a read or pass voltage or are applied with a program or erase voltage among the terminals of the memory cell devices. Meanwhile, if necessary, the terminals electrically connected to each other in the memory cell devices may be applied with a voltage for switching or a voltage for turning on or off the reference current source. The plurality of the pairs of memory cell devices included in the first and second cell strings constitute a plurality of the synapse morphic devices. As a result, the synapse strings having the first and second cell strings include a plurality of synapse morphic devices.

In the synapse string, the memory cell devices and the first switching devices constituting one synapse are preferably configured to perform an XNOR operation.

The memory cell devices of the first and second cell strings may be configured with MOSFETs having a non-volatile memory function. In this case, it is preferable that, in a pair of the memory cell devices, gate terminals or control gate terminals are connected to each other.

The first switching devices 12 and 22 are connected to only one of two-side ends of the first and second cell strings 10 and 20. In the present specification, for the convenience of description, ends of the first and second cell strings to which the first switching devices 12 and 22 are connected are defined as first ends of the first and second cell strings, and the remaining ends of the first and second cell strings are defined as the second ends. Input signals respectively input to the input terminals of the first switching devices may be configured with signals output from previous neurons. The first switching devices may be configured as one of a MOSFET, a MOSFET having a non-volatile memory function, and a device such as the memory cell device. FIG. 6A illustrates the first switching devices configured as MOSFETs or flash memory cell devices having a non-volatile memory function, and FIG. 5B illustrates the first switching devices configured as MOSFETs. In this case, the input terminals of the first switching devices may be a gate electrode or a control electrode, and in a case in which the first switching device is a device having a non-volatile memory function, the threshold voltage may be changed by using the non-volatile memory function.

In the synapse string, a pair of the memory cell device of the first cell string and the memory cell device of the second cell string constituting one synapse morphic device may be arranged at adjacent positions so that the characteristics of the two devices are the same.

FIG. 7 is a circuit diagram illustrating a second example of the synapse string according to the first embodiment of the present invention. Referring to FIG. 7, the second example of the synapse string according to the first embodiment of the present invention is further characterized in that second and third switch devices are further included in the synapse string according to the first example described above. Therefore, the second example of the synapse string according to the first embodiment of the present invention includes first and second cell strings 10 and 20 each having a plurality of memory cell devices 100 and 200 connected in series, first switch devices 12 and 22 each connected to the first ends of the first and second cell strings, second switch devices 14 and 24 connected in series to the first switch devices, and third switch devices 16 and 26 each connected in series to the second ends of the first and second cell strings. Since the structures and operations of the first and second cell strings and the first switch devices are the same as those of the first example described above, redundant descriptions thereof will be omitted.

Each of the second switch devices 14 and 24 is preferably connected in series to the first switch devices as illustrated in FIG. 7.

FIG. 8 is a circuit diagram illustrating a modified form of the second switch devices in the second example of the synapse string according to the first embodiment of the present invention. The modified form of the second switch devices may be connected in series between the first switch devices and the first ends of the first and second cell strings, as illustrated in FIG. 8. The third switch devices 16 and 26 are preferably connected in series to the second ends of the first and second cell strings, respectively.

Similarly to the first switch devices, it is preferable that each of the second and third switch devices is configured with one of a MOSFET, a MOSFET having a non-volatile memory function, and a device such as the memory cell device.

In the second example of the synapse string according to the first embodiment of the present invention, the first switch is input with an input value INPUT, and the second and third switches are provided so that the memory cell devices in the first and second cell strings can be programmed or erased independently.

The first and second cell strings can be programmed or erased separately from each other by using the second and third switches, or the first and second cell strings can be programmed or erased together. On the other hand, in the case of configuring the synapse string array, by using the second switch and the third switch, a specific synapse string can be selected from the synapse string array to be operated.

A third example of the synapse string according to the first embodiment of the present invention is characterized in that a second switch device is further included in the synapse string according to the first example described above.

Therefore, the third example of the synapse string according to the first embodiment of the present invention include the first and second cell string each having a plurality of memory cell devices connected in series and the first switch devices and second switch devices, each connected to the first ends of the first and second cell strings. Since the structures and operations of the first and second cell strings and the first switch devices are the same as those of the first example described above, redundant descriptions thereof will be omitted.

The second switch devices are connected in series to the first switch devices. The second switch devices are connected in series between the first switch devices and the first ends of the first and second cell strings. The second switch devices are preferably connected in series to the second ends of the first and second cell strings. Or, the second switch devices are most preferably connected in series to the second ends of the second switch devices. In the most preferable case, when the cell device of each synapse morphic device is programmed/erased, the threshold voltage of the cell device can be controlled independently by using the first switch device and the second switch device. Similarly to the first switch devices, the second switch devices preferably includes one among a MOSFET, a MOSFET having a non-volatile memory function, and a device such as the memory cell device. The second switch device according to the third example is operated in the same manner as the second or third switch device according to the second example. The first switch device and the second switch device can be used at the time of changing the threshold voltage by independently programming or erasing the cell devices of the synapse morphic devices. In the XNOR operation, an input signal is provided to the input of the first switch device.

FIGS. 9A to 9C are circuit diagrams illustrating a fourth example of the synapse string according to the first embodiment of the present invention. Referring to FIGS. 9A to 9C, the fourth example of the synapse string according to the first embodiment of the present invention is characterized in that a fourth switch device is further included in the synapse string according to the first example described above. Therefore, the fourth example of the synapse string according to the first embodiment of the present invention includes the first and second cell strings 10 and 20 each having a plurality of memory cell devices 100 and 200 connected in series, first switch devices 12 and 22 each connected to the first ends of the first and second cell strings, and the fourth switch devices 18 and 28. Since the first and second cell strings and the first switch devices are the same as those of the first example described above, redundant descriptions thereof will be omitted.

The fourth switch devices 18 and 28 are connected in series to the first switch devices electrically connected to each other and are connected in series to the second ends of the first and second cell strings electrically connected to each other as illustrated in FIG. 9A. The fourth switch devices are connected in series to only the first switch devices electrically connected to each other as illustrated in FIG. 9B. Or, the fourth switch devices are preferably connected in series to the second ends of the first and second cell strings electrically connected to each other. Similarly to the first switch devices, the fourth switch devices preferably includes one among a MOSFET, a MOSFET having a non-volatile memory function, and a device such as the memory cell device.

In a case where a synapse string array including a plurality of synapse strings is implemented, the fourth switch can be used to select a specific synapse string among the plurality of synapse strings or to synchronize the reference current source and the corresponding synapse strings with each other to operate the synapse strings.

FIG. 10 is a circuit diagram illustrating a fifth example of the synapse string according to the first embodiment of the present invention. Referring to FIG. 10, the fifth example of the synapse string according to the first embodiment of the present invention is characterized in that a fourth switch device is further included in the synapse string according to the second example described above. Therefore, the fifth example of the synapse string according to the first embodiment of the present invention includes the first and second cell strings 10 and 20 each having a plurality of memory cell devices 100 and 200 connected in series, first switch devices 12 and 22 each connected to the first ends of the first and second cell strings, second switch devices 14 and 24 connected in series to the first switch devices, third switch devices 16 and 26 each connected in series to the second ends of the two cell strings, and fourth switch devices 18 and 28. Since the first and second cell strings and the first, second and third switch devices are the same as those of the second example described above, redundant descriptions thereof will be omitted.

The fourth switch devices 18 and 28 are connected in series to the second switch devices electrically connected to each other and are connected in series to the third switch devices electrically connected to each other as illustrated in FIG. 10. The fourth switch devices are connected in series to only the second switch devices electrically connected to each other. The fourth switch devices are connected in parallel to only the third switch devices electrically connected to each other. Similarly to the first switch devices, the fourth switch devices preferably includes one among a MOSFET, a MOSFET having a non-volatile memory function, and a device such as the memory cell device.

In a case where a synapse string array including a plurality of synapse strings is implemented, the fourth switch can be used to select a specific synapse string among the plurality of synapse strings or to synchronize the reference current source and the corresponding synapse strings with each other to operate the synapse strings.

The synapse string including at least two cell strings and a switch device according to the present invention has high degree of integration due to a small occupied area and is reliable based on silicon technology. Since the synapse string can be used to implement various functions that need to be implemented in neuromorphic technology, the synapse string can be widely used in the field of neuromorphic technology.

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

What is claimed is:

1. A binary neural network comprising
a synapse string array in which a plurality of synapse strings are sequentially connected,
wherein the synapse string of the synapse string array includes:
first and second cell strings, each of which includes a plurality of memory cell devices connected in series; and
switching devices which are connected to first ends of two-side ends of the first and second cell strings,
wherein the memory cell devices of the first cell string and the memory cell devices of the second cell string are in one-to-on correspondence to each other, and a pair of the memory cell devices being in one-to-on correspondence to each other have one-side terminals electrically connected to each other to constitute one synapse morphic device,
wherein a plurality of the pairs of memory cell devices configured with the first and second cell strings constituting each synapse string constitute a plurality of the synapse morphic devices,
wherein the synapse morphic devices of each synapse string are electrically connected to the synapse morphic devices of other synapse strings, and terminals electrically connected to each other in the synapse morphic devices are terminals applied with a read or pass voltage or applied with a program or erase voltage, and wherein, when the read voltage is applied to the electrically connected terminals of the synapse morphic devices, an output value for a specific neuron of a post neuron layer is output.

2. The binary neural network according to claim 1, wherein the binary neural network further includes:
a sensing circuit unit which has a plurality of sense circuits connected to one-side ends of the plurality of synapse strings of the synapse string array, each sensing circuit configured to sense and output a current from the connected synapse strings; and
a signal summing circuit which sums values output from the plurality of sensing circuits of the sensing circuit unit and outputs a summation value,
wherein second ends of the two-side ends of the first and second cell strings of the synapse string of the synapse string array are connected to the sensing circuits.

3. The binary neural network according to claim 2,
wherein the terminals electrically connected to each other in the memory cell devices being in one-to-one correspondence with each other in the first cell string and the second cell string constituting each synapse string are terminals applied with a read or pass voltage or applied with a program or erase voltage, and
wherein a plurality of the pairs of memory cell devices configured with the first and second cell strings constituting each synapse string constitute a plurality of synapse morphic devices.

4. The binary neural network according to claim 2, wherein the memory cell devices and the switching devices constituting one synapse morphic device in the synapse string are configured so as to perform an XNOR operation.

5. The binary neural network according to claim 2,
wherein the sensing circuit unit further includes a reference current source for supplying a reference current, and
wherein each sensing circuit is input with a reference current ($I_{ref}$) flowing through the reference current source and compares the synapse string current ($I_{ss}$) for the synapse with the reference current to output the comparison result.

6. The binary neural network according to claim 2, wherein the sensing circuit unit compares the magnitude of the current of the first cell string with the current of the second cell string and outputs the comparison result.

7. The binary neural network according to claim 2, wherein the signal summing circuit is configured an adder or a counter.

8. The binary neural network according to claim 2, further comprising a comparator that compares a value output from the signal summing circuit with a preset reference value and outputs a comparison value.

9. A binary neural network comprising:
a synapse string array in which a plurality of synapse strings are sequentially connected; and
a switching circuit unit which switches when a sum of currents or voltages output from the synapse strings reaches a preset threshold value;
wherein the synapse string of the synapse string array includes:
first and second cell strings, each of which has a plurality of memory cell devices connected in series; and
switching devices which are connected to first ends of two-side ends of the first and second cell strings,
wherein second ends of the two-side ends of the first and second cell strings are coupled to each other to be connected to the switching circuit unit,
wherein the memory cell devices of the first cell string and the memory cell devices of the second cell string are in one-to-one correspondence with each other, and a pair of the memory cell devices being in one-to-one correspondence with each other have one-side terminals electrically connected to each other to constitute one synapse morphic device,
wherein a plurality of the pairs of memory cell devices configured with the first and second cell strings constituting each synapse string constitute a plurality of the synapse morphic devices, and
wherein the synapse morphic devices of each synapse string are electrically connected to the synapse morphic devices of other synapse strings, and terminals electrically connected to each other in the synapse morphic devices are terminals applied with a read or pass voltage or applied with a program or erase voltage.

10. The binary neural network according to claim 9,
wherein the terminals electrically connected to each other in the memory cell devices being in one-to-one correspondence with each other in the first cell string and the second cell string constituting each synapse string are terminals applied with a read or pass voltage or applied with a program or erase voltage, and
wherein a plurality of the pairs of memory cell devices configured with the first and second cell strings constituting each synapse string constitute a plurality of synapse morphic devices.

11. The binary neural network according to claim 9, wherein the memory cell devices and the switching devices constituting one synapse morphic device in the synapse string are configured so as to perform an XNOR operation.

12. The binary neural network according to claim 9, wherein the switching circuit unit includes:
a capacitor that stores a current or voltage input from the synapse string array; and
a comparator that compares a charging voltage of the capacitor with a preset reference value and outputting a comparison value.

13. The binary neural network according to claim 9, wherein the switching circuit unit includes a comparator configured to compare a current or voltage input from the synapse string array with a preset threshold value and to output a comparison value.

14. The binary neural network according to claim 9, wherein the switching circuit unit includes a device which performs steep switching when the current or voltage input from the synapse string array reaches a preset threshold value.

15. The binary neural network according to claim 9, wherein the switching device of the switching circuit unit is configured with a pnpn diode or a npnp diode that performs positive feedback.

16. The binary neural network according to claim 15, wherein in the switching device, a gate insulating film stack including an insulating layer having a charge storage function is further provided on the pnpn diode or the npnp diode; a gate electrode is provided on the gate insulating film stack; and at least one gate electrode is provided on an n or p region of the pnpn diode or the npnp diode.

17. The binary neural network according to claim 9, wherein the switching circuit unit includes:
a capacitor that stores a voltage input from the synapse string array; and
an insulator metal transition (IMT) device that performs steep switching when a charging voltage of the capacitor reaches a preset threshold value.

18. The binary neural network according to claim 9, wherein the switching circuit unit includes a MOSFET or a double-gate MOSFET which performs steep switching when a current or voltage input from the synapse string array reaches a preset threshold value.

19. The binary neural network according to claim 18, wherein in the switching circuit unit, a gate insulating film stack including an insulating layer having a charge storage function is provided at least between a gate electrode and a channel, and the gate insulating film stack includes a charge storage layer.

20. The binary neural network according to claim 18, wherein in the double-gate MOSFET of the switching circuit unit, a gate insulating film stack including an insulating layer having a charge storage function is provided at least between a gate electrode and a channel, and two gates are electrically separated from each other.

\* \* \* \* \*